United States Patent
Raghunath

[19]

[11] Patent Number: 5,805,481
[45] Date of Patent: Sep. 8, 1998

[54] UPDATE BLOCK FOR AN ADAPTIVE EQUALIZER FILTER CONFIGURATION CAPABLE OF PROCESSING COMPLEX-VALUED COEFFICIENT SIGNALS

[75] Inventor: Kalavai Janardhan Raghunath, Chatham, N.J.

[73] Assignee: Lucent Technologies, Inc., Murray Hill, N.J.

[21] Appl. No.: 581,635

[22] Filed: Dec. 28, 1995

[51] Int. Cl.$^6$ .................................................. G06F 17/10
[52] U.S. Cl. .................................. 364/724.19; 364/724.2
[58] Field of Search ........................ 364/724.19, 724.2; 375/232

[56] References Cited

U.S. PATENT DOCUMENTS

| | | | |
|---|---|---|---|
| 5,243,624 | 9/1993 | Paik et al. | 364/724.2 |
| 5,311,546 | 5/1994 | Paik et al. | 364/724.2 |
| 5,416,799 | 5/1995 | Currivan et al. | 364/724.2 |

OTHER PUBLICATIONS

Long, Guozhu, Fuyun Ling and John G. Proakis, "The LMS Algorithm with Delayed Coefficient Adaptation," *IEEE Transactions on Acoustics, Speech, and Signal Processing*, vol. 37, No. 9, Sep. 1989, pp. 1397–1405.

Weste, Neil H.E. and Kamran Eshraghian, *Principles of CMOS VLSI Design: A Systems Perspective*, Chapter 9 CMOS System Design Examles, 9.3 "A TV Echo Canceller," pp. 672–694, AT&T, U.S.A. 1993.

Lee, Edward A. Lee and David G. Messerschmitt, *Digital Communication*, 9.2 "Adaptive Linear Equalizer," pp. 385–394, Kluwer Academic Publishers, Boston, 1988.

Simon Haykin, *Adaptive Filter Theory*, Second Edition, "Stochastic Gradient–Based Algorithms," Chapter 9, pp. 299–307, Prentice Hall, Englewood Cliffs, NJ, 1988.

*Primary Examiner*—Tan V. Mai

[57] ABSTRACT

A method and apparatus are described for application to an adaptive equalizer, or filter, whereby complex valued coefficients for such an equalizer may be updated with a significant reduction in complexity as compared to prior art methods. Specifically, the method of the invention causes a sum and a difference to be determined for a real-valued and an imaginary-valued component of an input signal sample to the equalizer. Those sum and difference terms are then applied according to the method of the invention to a determination of an update term for a coefficient under consideration. Because the method of the invention results in a material reduction in the number of addition/subtraction operations required for the coefficient update process, the hardware infrastructure needed to implement that process is considerably simplified.

19 Claims, 9 Drawing Sheets

FIG. 6

| SIGNAL SAMPLE FROM RAM | $x_r(n-0.5)$ | $x_i(n-0.5)$ | $x_r(n-1.5)$ | $x_i(n-1.5)$ | $x_r(n)$ | $x_i(n)$ | $x_r(n-1.0)$ | $x_i(n-1.0)$ |
|---|---|---|---|---|---|---|---|---|
| COEFFICIENT SIGNAL PROVIDED BY MUX 30 | $C_{r1}$ | $C_{i1}$ | $C_{r3}$ | $C_{i3}$ | $C_{r0}$ | $C_{i0}$ | $C_{r2}$ | $C_{i2}$ |
| COEFFICIENT SIGNAL PROVIDED BY MUX 40 | $C_{i1}$ | $C_{r1}$ | $C_{i3}$ | $C_{r3}$ | $C_{i0}$ | $C_{r0}$ | $C_{i2}$ | $C_{r2}$ |
| | 1 | 2 | 3 | 4 | 5 | 6 | 7 | 8 |

CLOCK CYCLES

FIG. 10

CLOCK CYCLE

| | 1 | 2 | 3 | 4 |
|---|---|---|---|---|
| SIGNAL SAMPLE | X(n-0.5) | X(n-1.5) | X(n) | X(n-1) |
| 5 | $C_{r1}$ | $C_{r3}$ | $C_{r0}$ | $C_{r2}$ |
| 10 | $C_{r2}$ | $C_{r1}$ | $C_{r3}$ | $C_{r0}$ |
| 15 | $C_{i1}$ | $C_{i3}$ | $C_{i0}$ | $C_{i2}$ |
| 25 | $C_{i2}$ | $C_{i1}$ | $C_{i3}$ | $C_{i0}$ |

FIG. 11

| CLOCK CYCLE | SIGNAL PATH 630 | SIGNAL PATH 670 |
|---|---|---|
| 1 | X(n) | X(n-8) |
| 2 | X(n-2) | X(n-2) |
| 3 | X(n-4) | X(n-4) |
| 4 | X(n-6) | X(n-6) |

UPDATE BLOCK FOR AN ADAPTIVE EQUALIZER FILTER CONFIGURATION CAPABLE OF PROCESSING COMPLEX-VALUED COEFFICIENT SIGNALS

RELATED APPLICATIONS

This patent application is related to concurrently filed U.S. patent application Ser. No. 08/581,637, entitled "Update Block For An Adaptive Equalizer Filter Configuration," filed Dec. 28, 1995, (Raghunath 1) by Kalavai Raghunath, and concurrently filed U.S. patent application Ser. No. 08/581,634, entitled "Equalizer Filter Configuration For Processing Real-Valued And Complex Valued Signal Samples," (Mondal 1–3) filed Dec. 28, 1995, by Kalyan Mondal and Kalavai Raghunath, both assigned to the assignee of the present invention and herein incorporated by reference.

TECHNICAL FIELD

The present invention is related to equalizers and, more particularly, to adaptive equalizers.

BACKGROUND OF THE INVENTION

As is well-known, an equalizer filter may be implemented in either the direct form or the transpose form. See, for example, Chapter 9 of *Principles of CMOS VLSI Design*, by N. Weste and K. Eshraghian, available from Addison-Wesley Publishing Company, 1994, herein incorporated by reference. The transpose form is frequently employed because it provides a pipelined filter structure. An equalizer filter in the transpose form typically employs one multiply-accumulate (MAC) unit and one delay register per tap of the equalizer filter. However, an equalizer filter may be employed exploiting the feature that the clock frequency of the MAC units employed in the equalizer filter may exceed the input data rate or signal sample rate for the filter. In such a structure, if the clock frequency of the MAC units is F times faster than the signal sample rate, F being a positive integer, fewer MAC units may be employed because the MAC units may be time multiplexed. Therefore, a single MAC unit may implement several taps of the filter, referred to in this context as a "filter block." In addition, a random access memory-based (RAM-based) filter architecture may exploit this time-multiplexing approach and also reduce the number of delay registers needed by using random access memory instead.

In an adaptive Least-Mean-Squared (LMS) equalizer employing a RAM-based filter architecture, for example, referred to in this context as an adaptive RAM-based equalizer filter configuration, the filter coefficients are typically signals assumed to be available from storage. Thus, the adaptation of the coefficients in this signal form is typically performed "off-line" by an update block. An equalizer filter, depending upon the implementation, will typically process either complex-valued or real-valued signal samples. Likewise, the coefficient signals to be processed "offline" may either be real-valued or complex-valued. Processing complex-valued signal samples or complex-valued coefficient signals typically requires additional overhead in terms of hardware, such as additional adder-subtracters or other arithmetic units. It would be desirable if an update block or technique could process complex-valued coefficient signals without a significant amount of additional hardware overhead.

SUMMARY OF THE INVENTION

Briefly, in accordance with one embodiment of the invention, an update block for an adaptive equalizer configuration comprises: an update signal unit and an adder unit. The update signal unit and adder unit are coupled so as to have the capability to update a coefficient signal for an equalizer filter, the coefficient signal being provided to the adder unit. The update signal unit is adapted to provide to the adder unit an update signal based, at least in part, on at least one of a first and a second externally-derived signal, the first and second externally-derived signals respectively comprising the sum and difference of a real-valued and an imaginary-valued component of an input signal sample of the equalizer filter configuration.

Briefly, in accordance with another embodiment of the invention, a method of updating a complex-valued coefficient signal for an adaptive equalizer filter configuration comprising the steps of: providing a complex-valued input signal sample for the adaptive equalizer filter configuration and a complex-valued error signal sample from the adaptive equalizer filter configuration; computing the sum and difference of the real-valued and imaginary-valued signal sample components of the complex-valued input signal sample; and updating the coefficient signal with only one of the sum of the real-valued and imaginary-valued signal sample components and the difference of the real-valued and imaginary-valued signal sample components substantially in accordance with the complex-valued error signal sample provided.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof, may best be understood by reference to the following detailed description when read with the accompanying drawings in which:

FIG. 6 is a table illustrating the timing of selected coefficient signals in relation to signal sample components for a given sample period for the portion of an embodiment illustrated in FIG. 1.

FIG. 10 is a table illustrating the coefficient signal components provided during selected clock cycles at selected points in the embodiment of FIG. 8.

FIG. 11 is a table illustrating real-valued, delayed signal samples that may be provided by the embodiment of FIG. 9 to the embodiment of FIG. 8.

DETAILED DESCRIPTION

Figure 3:
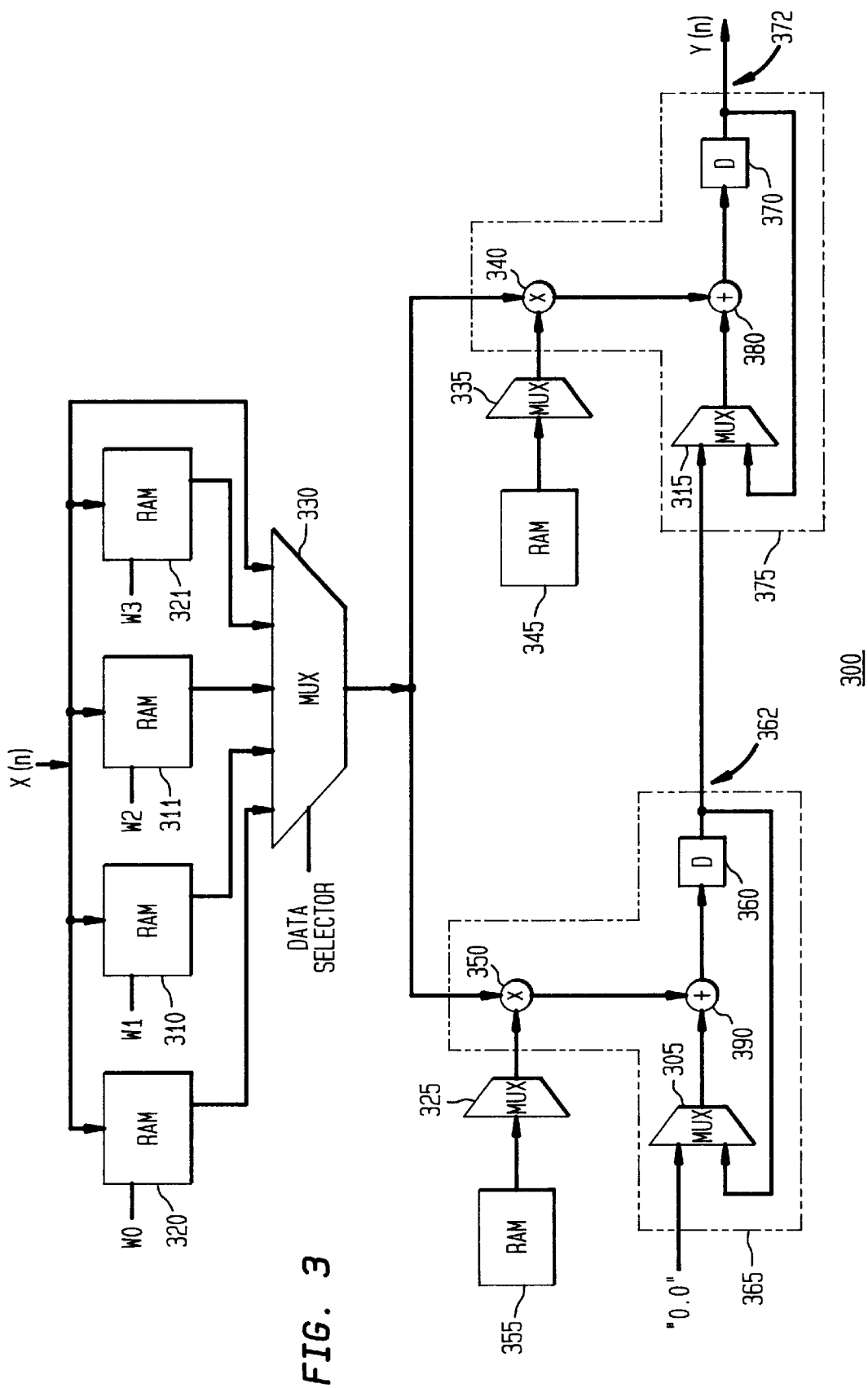
FIG. 3 is a schematic diagram illustrating an implementation of an equalizer filter configuration and random access memory (RAM) architecture for processing real-valued signal samples.

Equalizer filters, such as adaptive equalizer filters, are well-known. FIG. 3 is a block diagram illustrating an implementation 300 of a random access memory-based (RAM-based) architecture for an equalizer filter or equalizer filter configuration. As illustrated, discrete signal samples, designated X(n), become available periodically. Depending upon the particular application, such as for high definition television (HDTV), for example, the discrete signal samples may be obtained by downconverting a radio frequency (RF) signal to produce an analog signal and then performing analog-to-digit (A/D) conversion at a substantially predetermined signal sample rate. Typically, the digital signal samples comprise a predetermined number of binary digital signals, such as 10 bits, for example, provided in a parallel, twos complement format, for example. Of course, the invention is not restricted in scope in this respect. After A/D conversion, a plurality of real-valued digital signal samples may be provided, such as for vestigial sideband modulation (VSB).

These digital signal samples are available at a substantially predetermined signal sample rate. For example, in this implementation, assume that the signal sample rate is 10 MHz. If the multiply-accumulate (MAC) units, such as for filter block 365 and filter block 375, illustrated in FIG. 3, operate at 40 MHz, then this implementation may be employed to realize an 8-tap equalizer filter. It is noted, therefore, that in this implementation the clock frequency is an integer multiple of the signal sample rate. For example, each MAC unit may implement four equalizer filter taps because the clock frequency of the MAC unit is four times faster than the signal sample rate in this particular implementation.

For the implementation illustrated in FIG. 3, assume RAMs 310, 320, 311, and 321, each include two memory locations. As each discrete signal sample arrives at the 10 MHz rate, that signal sample may be written to a memory location in one of the RAMs and, likewise, the signal sample stored in that memory location may then be provided to MUX 330 and ultimately to filter blocks 365 and 375. Thus, in this particular implementation, currently available signal samples, designated X(n), may be provided via MUX 330 and delayed signal samples designated, for example, as X(n−2), X(n−4), and X(n−6), may also be provided via MUX 330. As explained in more detail hereinafter, the following expressions illustrate partial sums that may be respectively developed by filter block 365 and filter block 375 at output ports 362 and 372, respectively.

Filter Block 365: output signal $(n + 1) =$ (1)

$$C_1 X(n) + C_3 X(n-2) + C_5 X(n-4) + C_7 X(n-6)$$

Filter Block 375: output signal $(n + 1) =$ $$C_0 X(n) + C_2 X(n-2) + C_4 X(n-4) + C_6 X(n-6) + 365OS(n)$$

where 365OS(n)=the Filter Block 365 output signal at sample period n. Each filter block receives four signal samples via MUX 330 during a signal sample period.

Therefore, in this implementation the MAC units, operating at 40 MHz, may each form four products in that time, as illustrated by expressions (1) above. Thus, for example, referring to the MAC unit of filter block 365, signal sample X(n) is provided to multiplier 350. Likewise, coefficients stored as signals in RAM 355, such as $C_1$, $C_3$, $C_5$ and $C_7$, are provided to multiplier 350 via MUX 325. The output signal of multiplier 350 is then provided to adder 390. The sum of the signal provided by multiplier 350 and the signal provided via MUX 305 is then provided by adder 390 to delay unit 360. In this particular case, MUX 305 provides a zero signal, as illustrated in FIG. 3. Therefore, the signal value provided to delay unit 360 is the product, $C_1 X(n)$. Because the MAC units are operating at a clock frequency four times that of the signal sample rate, MUX 330 may then provide a delayed signal sample, such as X(n−2) from RAM 321, for example. Again, this is provided to multiplier 350. RAM 355 then provides a signal for a coefficient, such as $C_3$, via MUX 325 to multiplier 350. The product, $C_3 X(n-2)$, for example, is then produced by multiplier 350 and provided as a signal to adder 390. Likewise, delay unit 360 then provides the previous product, stored as a signal, to MUX 305 so that it may be summed by adder 390 with the signal just produced by multiplier 350. Thus, the partial sum, $C_1 X(n)+C_3 X(n-2)$, for example, is then provided to delay unit 360. This process is continued to obtain the expression for the output signal of filter block 365 provided in (1). Likewise, this partial sum is provided as the output signal of filter block 365 to the MAC unit of filter block 375 via port 362. It is noted that the MAC unit of filter block 375 also receives input signal samples X(n), X(n−2), X(n−4), and X(n−6). Thus, while the MAC unit of filter block 365 is computing a partial sum, the MAC unit of filter block 375 is also computing a partial sum. However, RAM 345 in this implementation stores different coefficient signals, such as for $C_0$, $C_2$, $C_4$, and $C_6$, for example. Furthermore, the partial sum computed by block 365 is then provided to filter block 375 via MUX 315. This is consistent with expressions (1). Furthermore, in this implementation, the output signal provided by the MAC unit of filter block 375 is also the equalizer filter output signal, Y(n). This may be summarized in accordance with the following equation.

$$Y(n) = C_7 X(n-7) + C_6 X(n-6) + C_5 X(n-5) + \quad (2)$$

$$C_4 X(n-4) + C_3 X(n-3) + C_2 X(n-2) + C_1 X(n-1) + C_0 X(n)$$

It is noted previously that RAMs 355 and 345 store as signals the coefficients for the equalizer filter. Alternatively, these RAMs may be updated with signals providing updated coefficients so that an adaptive equalizer may be implemented. Typically, updating of the coefficients is performed "off-line" and is based, at least in part, on an error signal or error signal samples produced by comparing the output signal of the adaptive equalizer with the output signal of a slicer. However, alternatively, an update block may be employed, such as described in aforementioned concurrently filed U.S. patent application Ser. No. 08/581,637 (Raghunath 1) or Ser. No. 08/581,637 (Mondal 1–3), although, again, the invention is not restricted in scope in this respect.

One disadvantage of the approach illustrated in FIG. 3 is that the equalizer filter shown will only process real-valued input signal samples. However, in a number of applications, it would be desirable if an equalizer filter had the capability to process either real-valued or complex-valued signal samples, depending upon the signal samples applied to the equalizer filter. For example, in digital TV, both quadrature amplitude modulation (QAM) and vestigial sideband modulation (VSB) may be employed. The former type of modulation produces complex-valued signal samples, whereas the latter type produces real-valued signal samples. The difficulty is that each approach typically employs a different equalizer filter configuration or architecture. Thus, a filter architecture having the capability to perform both types of signal processing without introducing a significant amount of additional hardware complexity or overhead would be desirable.

Figure 1:
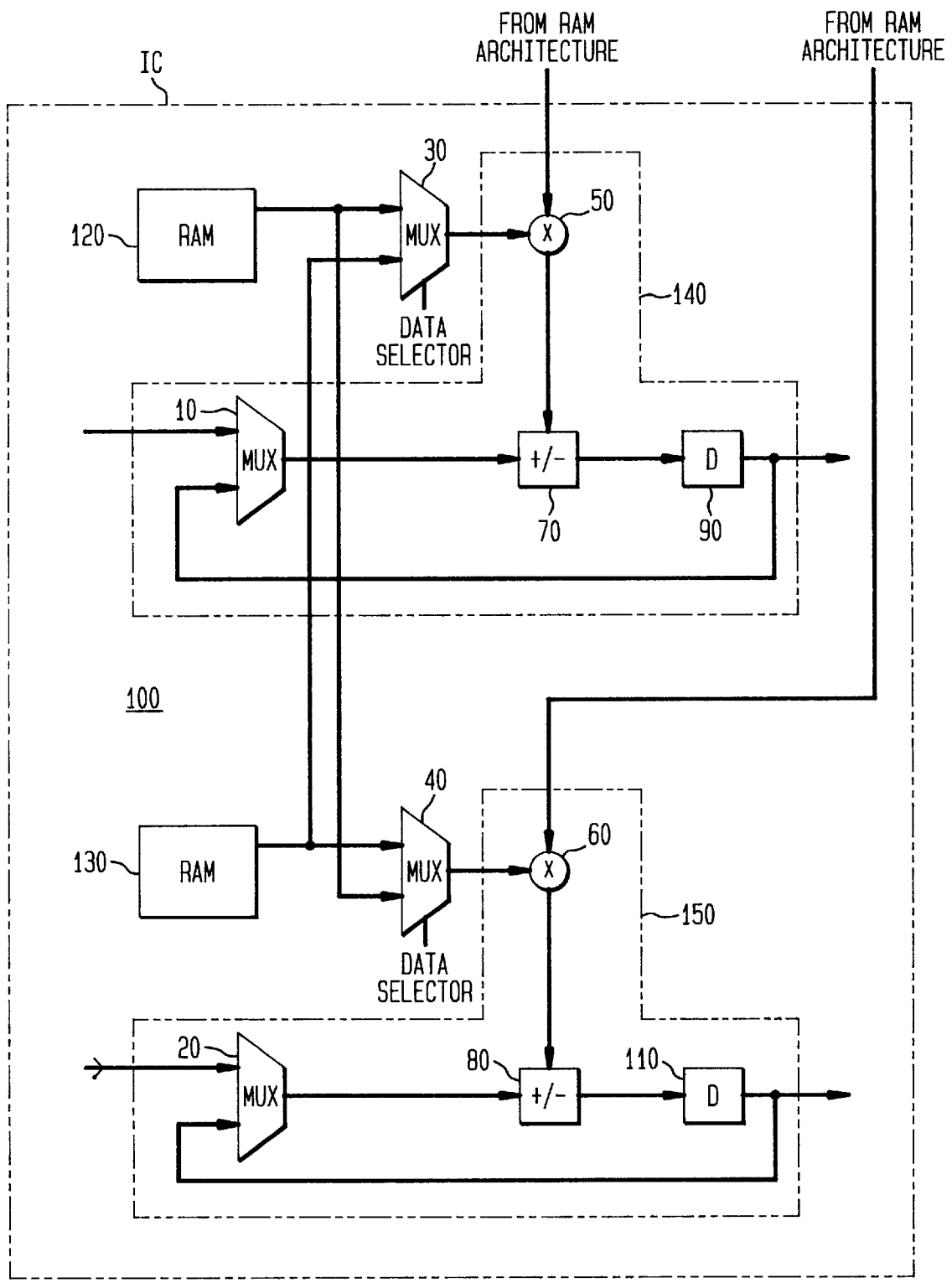
FIG. 1 is a schematic diagram illustrating a portion of an embodiment of an equalizer filter configuration.
Figure 2:
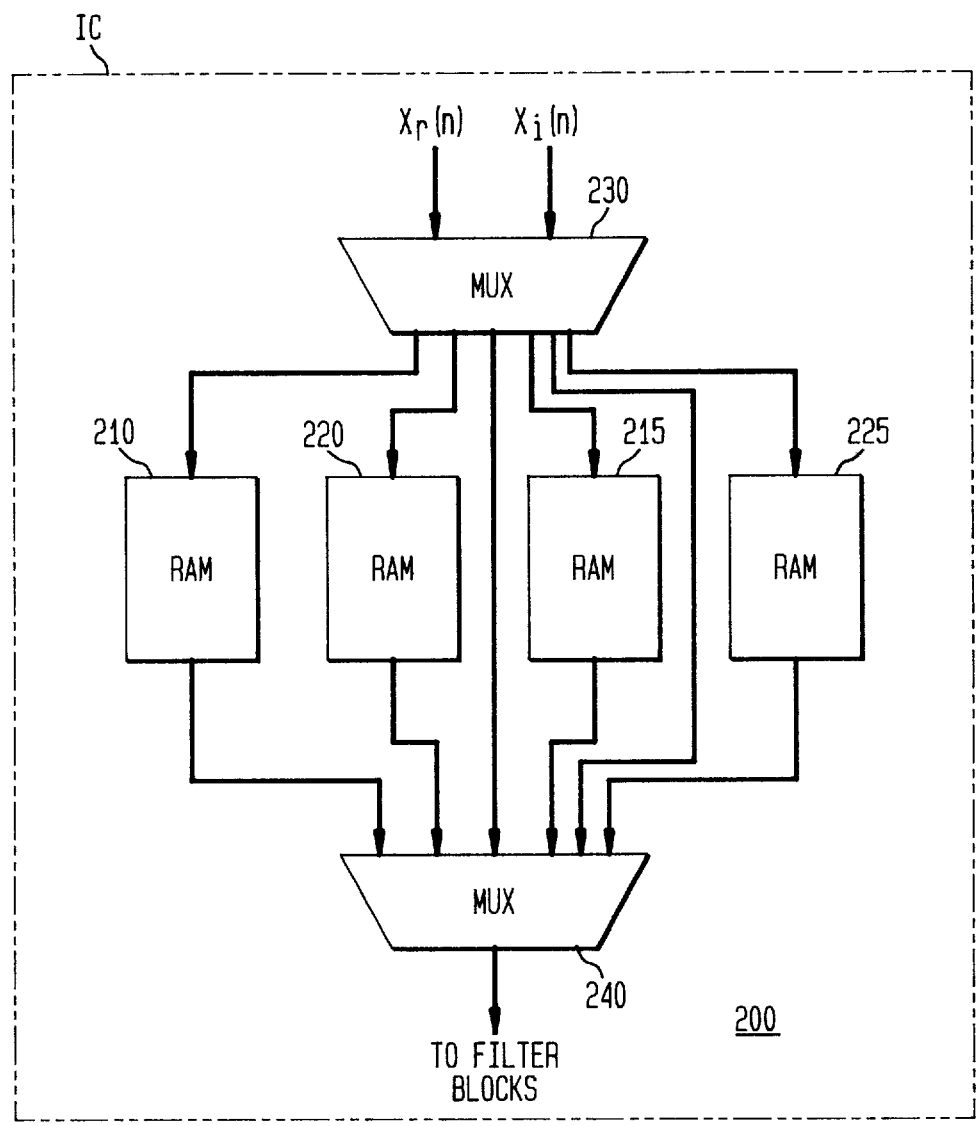
FIG. 2 is a schematic diagram illustrating an embodiment of a random access memory (RAM) architecture for the portion of an embodiment shown in FIG. 1.

FIG. 1 is a block diagram of a portion of an embodiment of an equalizer filter or equalizer filter configuration for processing real-valued and complex-valued signal samples. An embodiment of a RAM architecture that may be employed with this portion is illustrated in FIG. 2. Embodiment 100, shown in FIG. 1, has an architecture that allows the equalizer filter to process both real-valued signal samples and complex-valued signal samples, as described in more detail hereinafter. Assume in this particular embodiment that the complex-valued signal samples arrive at a 5 MHz rate, although the invention is not limited in scope in this respect. It will, of course, be appreciated that this signal sample rate provides an equivalent bit rate to the bit rate of the equalizer filter of FIG. 3, even though the signal sample rate is half of the signal sample rate for the filter configuration shown in FIG. 3. This follows, for example, for situations in which the imaginary-valued signal sample components and the real-valued signal sample components of the complex-valued signal samples for the configuration of FIG. 2 each employ the same number of bits as the real-valued signal samples processed by the equalizer filter configuration of FIG. 3. Likewise, as illustrated by the embodiment shown in FIG. 1, this particular embodiment of a filter block includes two multiply-accumulate units, 140 and 150, whereas for the implementation shown in FIG. 3, a single MAC unit is employed for each filter block. Nonetheless, embodiment 100 shown in FIG. 1 may be employed to operate like the implementation shown in FIG. 3 based upon the use of MUXes 30 and 40 in FIG. 1. Thus, it has the capability to process both real-valued and complex-valued signal samples, as explained in more detail hereinafter. MUXes 30 and 40 include a data selector that may be employed to select RAM 120 for MUX 30 and RAM 130 for MUX 40 so that MAC units 140 and 150 may each correspond to respective filter blocks of an equalizer filter for processing real-valued signal samples, such as filter block 365 and filter block 375 shown in FIG. 3, for example. However, the embodiment shown in FIG. 1 also has the additional capability to perform processing for complex-valued signal samples, which the embodiment shown in FIG. 3 does not have the capability to perform. When the embodiment shown in FIG. 1 is operated in this complex-valued signal sample processing mode, MAC unit 140 provides a real-valued output signal sample whereas MAC unit 150 provides an imaginary-valued output signal sample. Furthermore, MAC unit 140 via MUX 30 may obtain coefficient signals from RAM 120 or RAM 130 and, likewise, for MAC unit 150 via MUX 40, as explained in more detail hereinafter. In this embodiment, therefore, embodiment 100 comprises a filter block including two mutually-coupled MAC units. Each of the two mutually coupled MAC units includes a MUX that mutually couples the MAC units so that the MAC units include the capability to share multiplier or coefficient signals stored in the RAMs of the two respective MAC units.

For an equalizer filter to have the capability to process complex-valued signal samples, it should have the ability to process signal samples and coefficient signals in accordance with the following form.

$$Y(n) = Y_r(n) + jY_i(n) \quad (3)$$

$$X(n) = X_r(n) + jX_i(n)$$

$$C_k = C_{rk} + jC_{ik}$$

where $X(n)$ are the input signal samples, $Y(n)$ are the output signal samples, and $C_k$ are the coefficient signals, k being an integer index. Likewise, $Y_r(n)$, $X_r(n)$ and $C_{rk}$ represent real-valued components and $Y_i(n)$, $X_i(n)$, and $C_{ik}$ represent imaginary-valued components of the respective signal samples and signals. Consider, for example, an N-tap equalizer filter for quadrature amplitude modulation (QAM), N being a positive integer, where T/2 sampling is employed, T being the sample period. Therefore, a fractionally spaced linear equalizer (FSLE) is employed, although the invention is not limited in scope in this respect. For the implementation of FIG. 1, N is 4 complex taps, in comparison with the 8 real taps for the implementation of FIG. 3. Thus, to employ an architecture with the same number of MAC units and substantially the same clock frequency to implement a FSLE capable of processing complex-valued signal samples, for example, $Y(n)$ should have the following form.

$$Y(n)=C_0X(n)+C_1X(n-0.5)+C_2X(n-1)+C_3X(n-1.5) \quad (4)$$

Therefore, although the same number of MAC units may be employed, the span of the filter is less. Furthermore, where the coefficient signals and the input signal samples have the form of equations (3) above, the output signal samples, $Y(n)$, may be expressed in real-valued and imaginary-valued components in accordance with the following equations.

$$Y_r(n) = C_{r0}X_r(n) - C_{i0}X_i(n) + C_{r1}X_r(n-0.5) - C_{i1}X_i(n-0.5) + \quad (5)$$
$$C_{r2}X_r(n-1) - C_{i2}X_i(n-1) + C_{r3}X_r(n-1.5) - C_{i3}X_i(n-1.5)$$

$$Y_i(n) = C_{r0}X_i(n) + C_{i0}X_r(n) + C_{r1}X_i(n-0.5) + C_{i1}X_r(n-0.5) +$$
$$C_{r2}X_i(n-1) + C_{i2}X_r(n-1) + C_{r3}X_i(n-1.5) + C_{i3}X_r(n-1.5)$$

Therefore, the real-valued and imaginary-valued components for the output signal samples of a filter block of an equalizer filter capable of processing complex-valued signal samples may have the following form.

$$RTAP100(n+1) = C_{r0}X_r(n) - C_{i0}X_i(n) + \quad (6)$$
$$C_{r1}X_r(n-0.5) - C_{i1}X_i(n-0.5) + C_{r2}X_r(n-1) - C_{i2}X_i(n-1) +$$
$$C_{r3}X_r(n-1.5) - C_{i3}X_i(n-1.5)$$

$$ITAP100(n+1) = C_{r0}X_i(n) + C_{i0}X_r(n) +$$
$$C_{r1}X_i(n-0.5) + C_{i1}X_r(n-0.5) + C_{r2}X_i(n-1) + C_{i2}X_r(n-1) +$$
$$C_{r2}X_i(n-1.5) + C_{i2}X_r(n-1.5)$$

where RTAP 100 is the output signal sample produced by MAC unit 140 and ITAP100 is the output signal sample produced by MAC unit 150 in this particular example. These equations may be implemented by the embodiment shown in FIG. 1.

Of course, the invention is not limited in scope to a particular equalizer filter. The embodiment of FIG. 1 merely illustrates an architecture for implementing a complex four tap equalizer filter. Likewise, the particular MAC unit structure illustrated is not essential. Other MAC unit structures may provide satisfactory performance. Nonetheless, embodiment 100 of an equalizer filter configuration is flexible and includes the capability to process both real-valued and complex-valued signal samples. One skilled in the art will now appreciate that this architecture may be extended in a variety of ways including: number of RAMs, clock frequency, signal sample rate, number of filter taps, number of filter blocks, and number of MAC units, to name only a few possible variations. For example, the previous embodiment implements a 4 tap complex T/2 filter. Nonetheless, it may be extended to any size filter, including multiples of four, as illustrated. A 64-tap complex filter, for example, may employ 4 RAMs, each of size 32, and 16 complex filter blocks.

Figure 4:
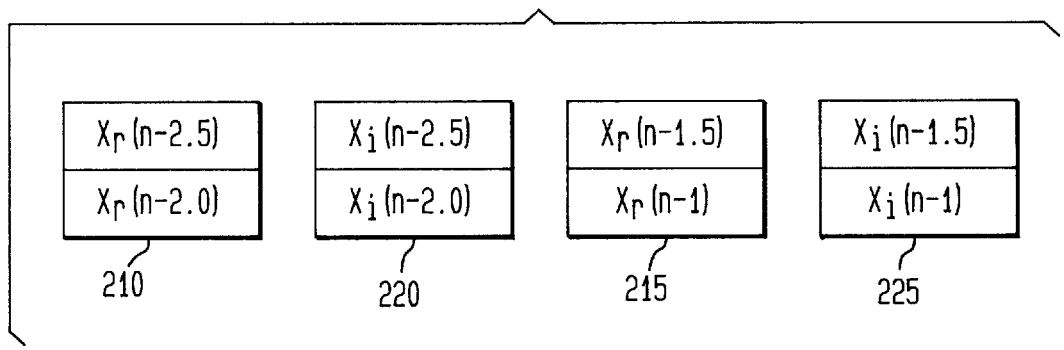
FIG. 4 is a schematic diagram illustrating the memory locations of signal sample components in RAM for the embodiment illustrated in FIG. 2.
Figure 5:
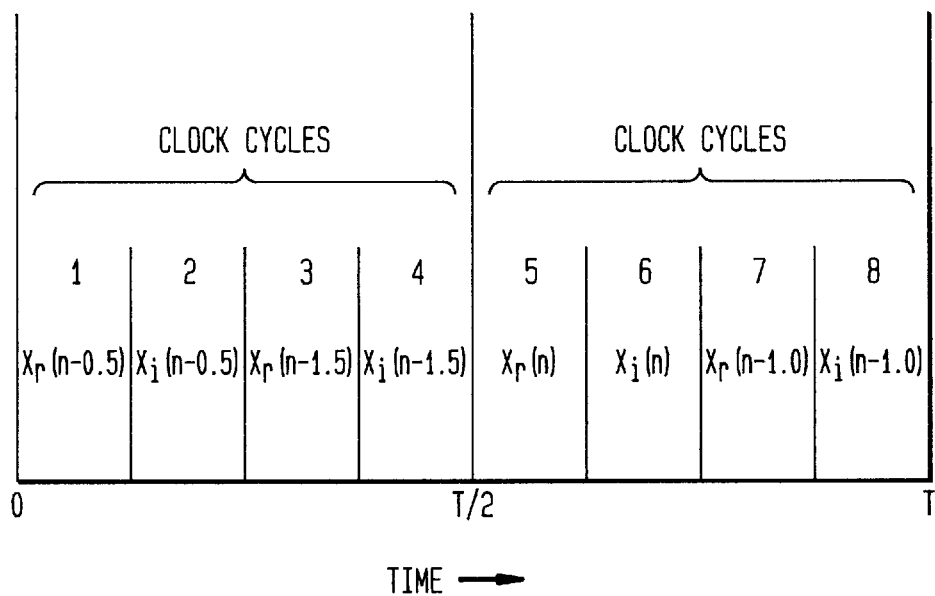
FIG. 5 is a timing diagram illustrating the timing of multiplexing of signal sample components for a given signal sample period for the portion of an embodiment illustrated in FIG. 1.

In order to take advantage of the timing regarding the availability of signal samples, as illustrated by the portion of the embodiment shown in FIG. 2, complex-valued signal samples that are provided to MUX 230 are written to RAMs 210, 220, 215, and 225. The signal samples stored in the respective RAMs are then provided to MUX 240 for the filter blocks, such as embodiment 100 illustrated in FIG. 1. Because, as previously explained, the signal sample rate for the complex-valued signal samples is half of the rate for the implementation illustrated in FIG. 3, although the signal samples are fractionally-spaced, sufficient time is provided to read and write the real-valued and imaginary-valued components of the signal samples. Thus, during a signal sample period of a complex-valued signal sample, eight multiply operations may be performed in this particular embodiment, for example. First, the complex-valued signal sample may be made available, via MUX 230 and MUX 240, to embodiment 100, illustrated in FIG. 1. For example, first a signal sample component, such as a real-valued component, $X_r(n-0.5)$, for example, may be provided via MUX 240 to multipliers 50 and 60 and then on the next clock cycle of the MAC units, which is eight times the signal sample rate, another signal sample component, such as the imaginary-valued component, $X_i(n-0.5)$, for example, may be provided via MUX 240 to multipliers 50 and 60. The real-valued and imaginary-valued signal component of this complex-valued signal sample may then be written into the RAMs and the real and imaginary-valued signal components of a signal sample stored in a selected memory location may then be read from the RAMs and provided by MUX 240, again to embodiment 100 illustrated in FIG. 1. These signal components have been effectively delayed by storage in the RAM. For example, signal components for $X_r(n-1.5)$ and $X_i(n-1.5)$, as illustrated in FIG. 4, may be read from the RAMs. Therefore, on the next clock cycle, the real-valued component, $X_r(n-1.5)$, for example, may be provided to multipliers 50 and 60, and, on yet another clock cycle, the imaginary-valued component, $X_i(n-1.5)$, for example, may be provided. This process may then be repeated for signal sample components $X_r(n)$, $X_i(n)$, $X_r(n-1)$, and $X_i(n-1)$. As described above regarding the signal sample, components $X_r(n)$ and $X_i(n)$ become available via MUXes 230 and 240, are stored in the RAMs, and then components $X_r(n-1)$ and $X_i(n-1)$ are read from the RAMs. One possible sequence of multiplexing of component signal samples during a signal sample period for the embodiment of FIGS. 1 and 2 is illustrated in FIG. 5. Thus, FIG. 5 illustrates the signal sample components provided via MUX 240 to multipliers 50 and 60 during eight clock cycles synchronized with a single signal sample period for this particular embodiment. FIG. 4 illustrates a possible memory map of RAMs 210, 220, 215 and 225 for the delayed signal sample components. Likewise, in this embodiment, RAM 120 and RAM 130 respectively contain the real-valued and imaginary-valued components of the complex-valued coefficient signals that may be provided via MUXes 30 and 40 to multipliers 50 and 60 to ensure that the proper product-signal is formed by multipliers 50 and 60. FIG. 6, for example, is a table illustrating the real-valued and imaginary-valued coefficient signals to be provided via MUXes 30 and 40 for processing with the various real-valued and imaginary-valued signal components provided via MUX 240. The top row corresponds to the signal sample components shown in FIG. 5 and the next two rows provide the coefficient signal components provided by the designated MUX for processing by a multiplier with the particular signal sample component. Likewise, these output signals are provided to adder-subtracters 70 and 80, illustrated in FIG. 1. It is noted that 70 and 80 perform both addition and subtraction in this particular embodiment so that products of a coefficient signal component and a signal sample component having a negative coefficient signal may be suitably handled. Therefore, after multipliers 50 and 60 form products, some of the resulting signals are subtracted rather than added, in accordance with equations (6) in this particular embodiment. For example, the adder-subtracter may include digital circuitry so that the binary digital signals are stored in twos complement and bit manipulation may be employed, although other approaches are also possible. For example, a simple adder may be employed and separate circuitry to perform the bit manipulation may also be employed.

Of course, FIGS. 4, 5 and 6 are merely provided to illustrate the operation of a particular embodiment. The embodiment illustrated in FIGS. 1 and 2 includes the capability to process real-valued signal samples without adding or modifying the architecture of the component blocks; however, it will now be appreciated that in the mode of operation in which real-valued signal samples are processed, the location of signal samples in memory and the multiplexing of signal samples and coefficients will not be in accordance with FIGS. 4, 5 and 6. Instead, these aspects of the operation of this particular embodiment will be similar to the approach described in conjunction with FIG. 3. For example, signal samples are provided to MUX 230 at the 10 MHz rate along the signal path designated $X_r(n)$ in FIG. 2, for this particular embodiment. Likewise, control signals may be employed, such as provided to MUXes 30, 40, 230 and 240, as examples, to ensure that real-valued signal samples are processed in the appropriate manner.

As illustrated in FIG. 1, the output signal produced by adder-subtracters 70 and 80 may then be provided to a delay unit, such as delay units 90 and 110, so that on the next clock cycle, the output signal produced by multipliers 50 and 60, via MUXes 10 and 20, may be added to or subtracted from the output signal produced by adder-subtracters 70 and 80. Of course, typically, control signals are provided to ensure that subtraction occurs at the appropriate instance in accordance with the previous equations, such as equations (6). Thus, in this way, after eight clock cycles of the MAC units or one signal sample period, delay units 90 and 110 may provide for the next filter block, in these embodiments employing multiple filter blocks, output signals. Thus, as discussed with respect to FIG. 3, for the portion of the embodiment illustrated in FIG. 1, a plurality of filter blocks may be operating in parallel receiving the same signal sample components from RAM, but applying different coefficient signals at each filter block to implement the equalizer filter configuration. Likewise, MUXes 30 and 40 are employed because each MAC unit, such as MAC units 140 and 150, require both the real-valued and imaginary-valued components for the coefficients, such as $C_0$, $C_1$, $C_2$, and $C_3$, in this embodiment. This is illustrated by the table in FIG. 6, for example. However, to conserve memory, each RAM unit only stores the real-valued or imaginary-valued component for the four coefficients. Of course, alternatively, each RAM may store both components for two of the four coefficients, again utilizing MuXes 30 and 40.

As previously explained for a RAM-based filter architecture, the coefficients of the adaptive equalizer filter take the form of signals, referred to in this context as coefficients or multipliers signals, to be applied to the signal samples being processed by the equalizer filter. The coefficient signals are typically available from storage. Therefore, as previously explained, adaptation or updating of the coefficient signals is performed "off-line" by a separate MAC unit, typically. One problem with this approach, however, is that it reduces the convergence rate of the equalizer filter output signal. Also, additional memory may be required. Concurrently filed aforementioned U.S. patent application Ser. No. 08/581,637 (Raghunath 1), describes an update block for an adaptive RAM-based equalizer filter configuration in which the coefficient signals are not processed "off-line." The embodiment illustrated in FIG. 1 of that patent application has the capability to process real-valued signal samples and coefficient signals, such as are employed in vestigial sideband modulation (VSB). It would also be advantageous if an update block, such as for an adaptive RAM-based equalizer filter configuration, for example, had the capability to process complex-valued coefficient signals without a significant amount of additional hardware overhead, although an update block of an adaptive equalizer filter configuration capable of processing complex-valued coefficient signals in accordance with the invention is not limited in scope to RAM-based adaptive equalizer filter configurations. Likewise, it would be advantageous if such an approach might also be employed to process real-valued coefficient signals. One advantage of such an approach is that such an equalizer filter configuration would have the capability to operate upon signal samples employing quadrature amplitude modulation (QAM) and also vestigial sideband modulation (VSB).

As is well-known, coefficient signals for an adaptive equalizer may be updated in accordance with the following equation.

$$C_i(n+1) = C_i(n) + e(n)X(n-i) \tag{7}$$

where n is a positive integer indexing the discrete signal sample periods, $X(n)$ is the input signal sample of the equalizer filter, $e(n)$ is the error signal sample of the equalizer filter produced by comparing the equalizer filter output signal with the output signal of a slicer, and $C_i(n)$ is a current equalizer filter coefficient signal to be updated. It is noted that where the sample period index is omitted in connection with a coefficient, the index is understood based upon the particular context.

As described in aforementioned concurrently filed patent application Ser. No. 08/581,637 (Raghunath 1), the error signal samples and the input signal samples may be selectively variably delayed, although the scope of the present invention is not limited in this respect. Thus, for example, an update equation such as for a coefficient $C_0$ may have the following form, as an example.

$$C_0(n+1) = C_0(n) + e(n-a)X(n-i-a) \tag{8}$$

where a is a predetermined amount of delay, in terms of signal sample periods, applied to the respective error signal samples, $e(n)$, and input signal samples, $X(n-i)$. It will, of course, be understood, that the approach of equation (8) need not be employed and other possible update equations may be implemented. However, as described in concurrently filed patent application Ser. No. 08/581,637 (Raghunath 1), the error signal samples and input signal samples are selectively variably delayed. Furthermore, the variable delay is selected so that the signal samples available from storage in the RAMs may be conveniently employed. If an update employing complex-valued signal samples and coefficient signals is to be performed, such as in accordance with equation (8), for example, the update equation may typically be rewritten in terms of its real-valued and imaginary-valued components. For example, equation (8) above would have the following form where the error signal samples, the input signal samples and the coefficient or multiplier signals were represented in terms of their real-valued and imaginary-valued components.

$$C_{or}(n+1) = C_{or}(n) + e_r(n-a)X_r(n-i-a) - e_i(n-a)X_i(n-i-a)$$

$$C_{oi}(n+1) = C_{oi}(n) + e_i(n-a)X_r(n-i-a) + e_r(n-a)X_i(n-i-a) \tag{9}$$

where an r subscript denotes a real-valued component and an i subscript denotes an imaginary-valued component.

Figure 7:
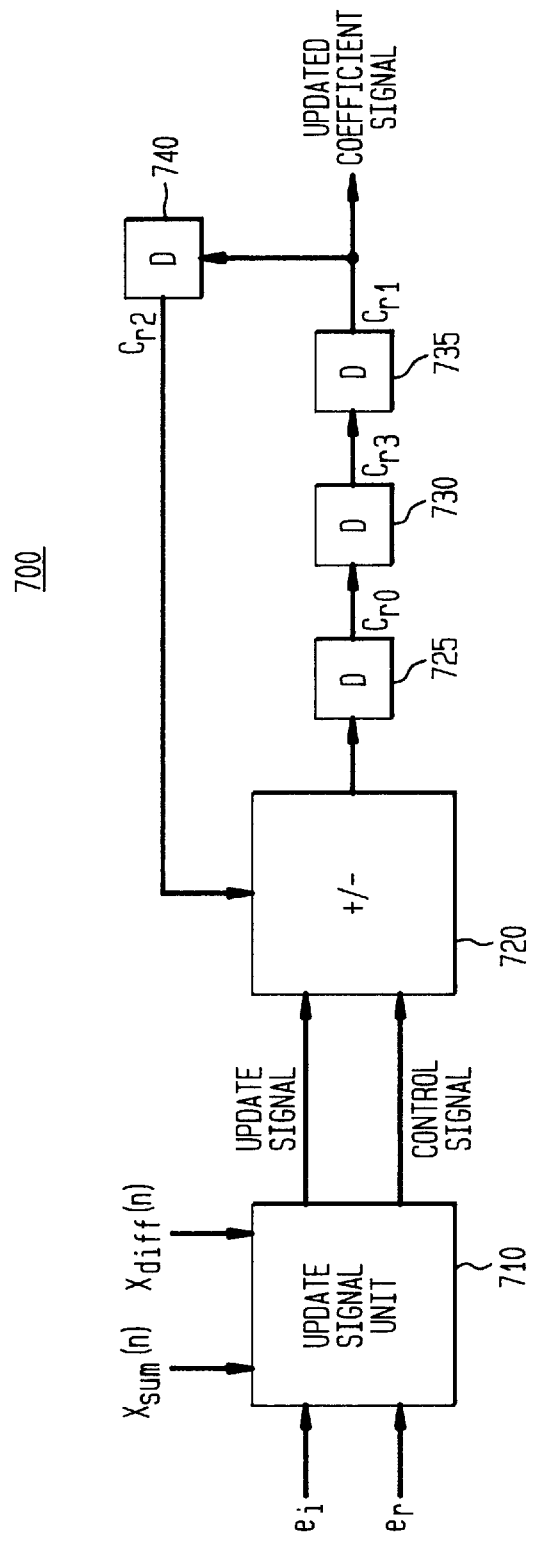
FIG. 7 is a schematic diagram illustrating one embodiment of an update block for an adaptive equalizer filter configuration capable of processing complex-valued coefficient signals in accordance with the invention.

Embodiment 700 of an update block for an adaptive equalizer filter configuration capable of processing complex-valued coefficient signals in accordance with the invention, illustrated in FIG. 7, may be employed to implement equations (9) above, where, for this particular embodiment, the real-valued and imaginary-valued signal components of the error signal sample take on values of positive one and negative one only. This is referred to in this context as "sign LMS." Furthermore, in this particular context, the term "update signal unit" refers to circuitry or structure that produces or generates the update signal to be added or subtracted from the coefficient signal to be updated, whereas the term "update block" refers to circuitry that produces or generates the updated coefficient signal and, therefore, includes the update signal unit. Of course, embodiment 700 may be embodied on an integrated circuit (IC), although the invention is not limited in scope in this respect.

For the embodiment illustrated in FIG. 7, assume $X_{sum}$ and $X_{diff}$ are in accordance with the following equations.

$$X_{diff}(n) = X_r(n) - X_i(n)$$

$$X_{sum}(n) = X_r(n) + X_i(n) \tag{10}$$

where $X_r(n)$ denotes the real-valued component of complex-valued signal sample $X(n)$ and $X_i(n)$ denotes the imaginary-valued component of complex-valued signal sample $X(n)$. Update block 700 may then be employed as described in more detail hereinafter to implement equations (9). Assume that the appropriate values for the error sample signal and the input signal sample are provided to update signal unit 710. For example, as illustrated by equation (8) above, for coefficient $C_0$, the error signal sample may be delayed by "a" sample periods and the input signal sample may also be delayed by "a" additional sample periods. The technique described in aforementioned concurrently filed U.S. patent application Ser. No. 08/581,637 (Raghunath 1) may be employed, for example, although the invention is not restricted in scope in this respect. Thus, in this example, in equation (10), $X_r(n)$ is replaced by $X_r(n-i-a)$ and $X_i(n)$ is replaced by $X_i(n-i-a)$. When these signal samples are provided to update signal unit 710, update signal unit 710 may then be employed in update block 700 to process these complex-valued signal samples. For example, as illustrated, the real-valued and imaginary-valued components of the error sample signal are provided to the update signal unit in this embodiment. Likewise, as previously described, $X_{sum}$ and $X_{diff}$ are likewise provided. As equations (9) illustrate, where sign LMS is employed, the portion of the previous equations that represent the product of the error signal sample and the input signal sample should comprise either the sum or difference of the real-valued and imaginary-valued components of the input signal sample. Thus, based upon the real-valued and imaginary-valued components of the error signal sample provided to update signal unit 710, either $X_{sum}$ or $X_{diff}$ may be provided to adder-subtracter 720. In addition, update signal unit 710 also provides a control signal indicating whether the signal value provided by the update signal unit should be added or subtracted from the signal value provided to unit 720 from delay unit 740. Because delay unit 740 provides the prior signal value of the coefficient, such as $C_{or}(n)$ or $C_{oi}(n)$ for equations (9) above, in this particular embodiment due to the operation of delay units 725, 730, 735 and 740 forming a digital delay loop signal with adder-subtracter 720, the update equation (9) may be implemented with a single adder-subtracter. More specifically, update signal unit 710 has the capability to provide to unit 720 the four possible signal values for the product of the error signal sample and the input signal sample in the manner previously described. Further, it will now be appreciated that this approach is independent of the amount of delay realized for the input signal sample and the error signal sample.

Figure 8:
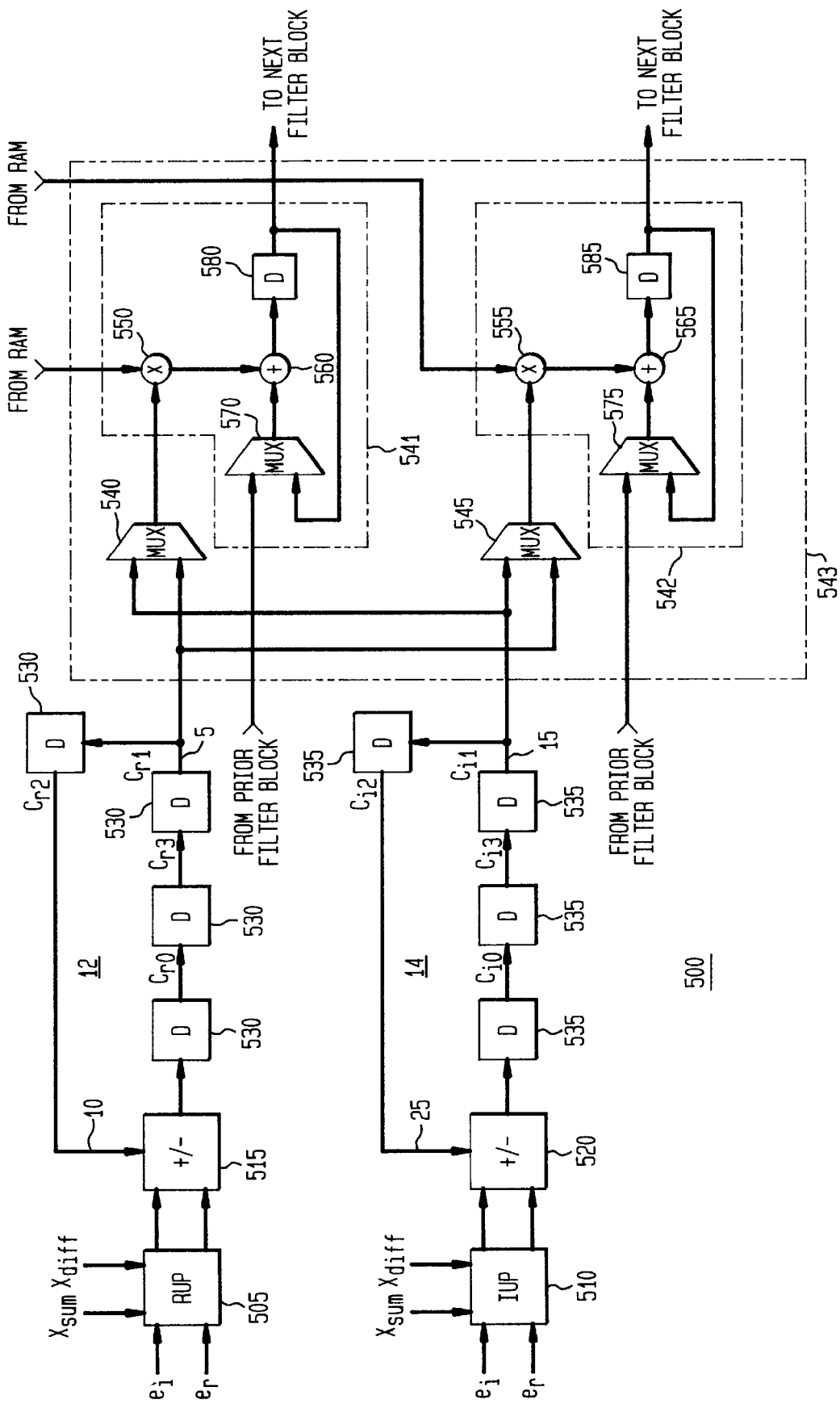
FIG. 8 is a schematic diagram illustrating an embodiment of an adaptive equalizer filter configuration including the embodiment of FIG. 7.
Figure 9:
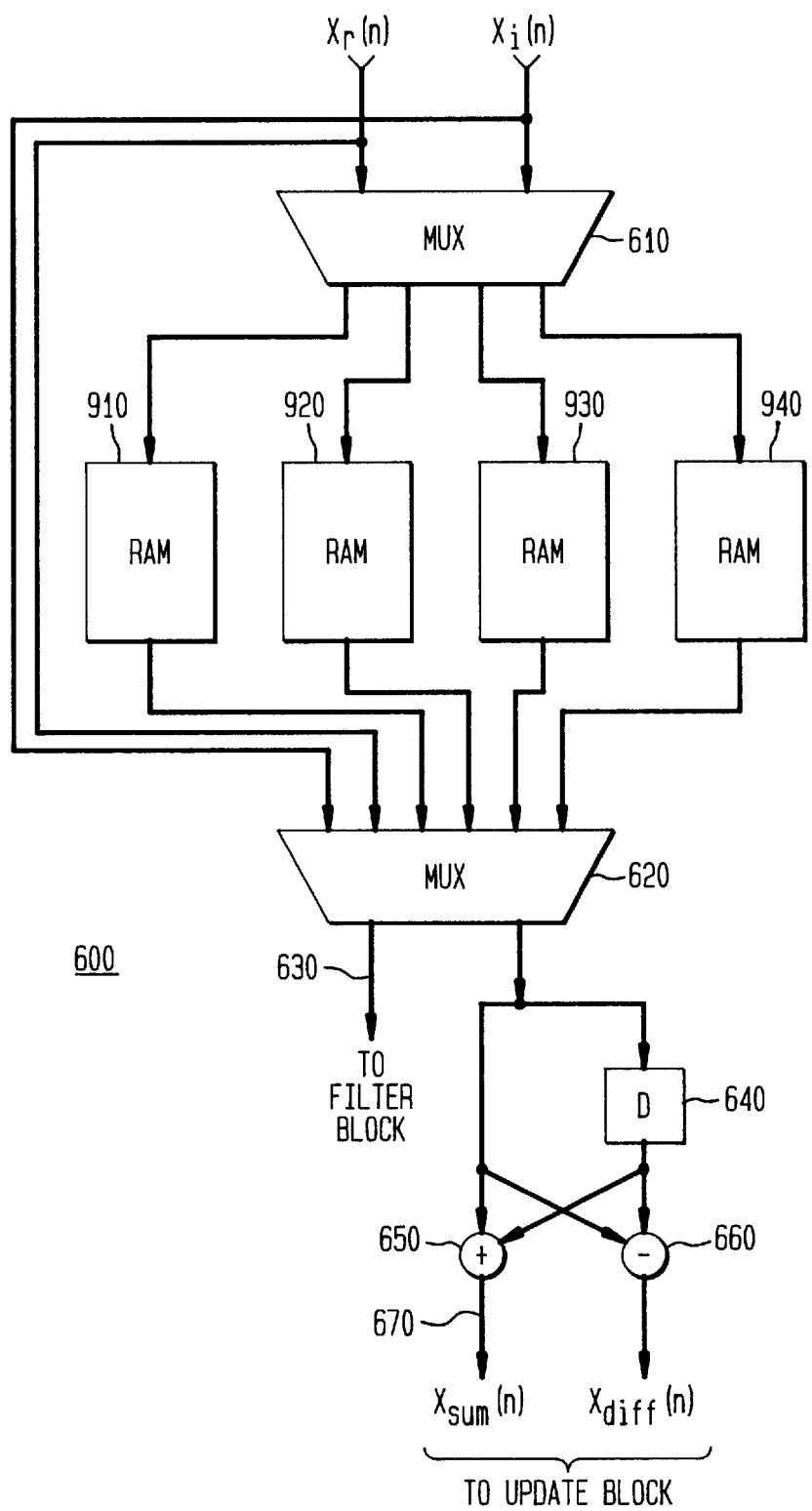
FIG. 9 is a block diagram illustrating an embodiment of an random access memory (RAM) architecture that may employed in conjunction with the embodiment of FIG. 8.

FIG. 8 and FIG. 9 together show a schematic diagram of embodiment of an adaptive RAM-based equalizer filter configuration including an update block in accordance with the invention. As illustrated, FIG. 8 includes the embodiment shown in FIG. 7. It will now be appreciated that the embodiment of an adaptive RAM-based equalizer filter configuration shown includes two of the embodiments of an update block shown in FIG. 7. These are both provided so that one update block may process real-valued components of the complex-valued coefficient signals and another update block may process imaginary-valued components of the complex-valued coefficient signals. As equations (9) indicate, the output signal of the update unit will not be identical for update signal units 505 (RUP for real update signal unit) and 510 (IUP for imaginary update signal unit) for the same input signals. For the embodiment of an adaptive RAM-based equalizer filter configuration shown, in addition to having an update block capable of processing real-valued and complex-valued components, a filter block is provided also capable of processing both real-valued and complex-valued signal samples, such as described in aforementioned concurrently filed U.S. patent application Ser. No. 08/581,634 (Mondal 1–3), and previously illustrated in FIGS. 1 and 2, although the invention is not restricted in scope in this respect. Likewise, as illustrated in this particular embodiment, where, for the processing of complex-valued signal samples, the clock frequency of the update block occurs at a rate exceeding the signal sample rate, such as eight times the signal sample rate for this embodiment, the update signal unit, adder-subtracter and delay units are coupled in a manner so that full-rate equalizer filter coefficient adaptation may be performed, such as described in aforementioned concurrently filed U.S. patent application Ser. No. 08/581,637 (Raghunath 1). In this embodiment, this is performed in accordance with the following equations:

$$C_0(n+1) = C_0(n) + e(n-1)X(n-1)$$

$$C_1(n+1) = C_1(n) + e(n-1)X(n-1.5)$$

$$C_2(n+1) = C_2(n) + e(n-1)X(n-1)$$

$$C_3(n+1) = C_3(n) + e(n-1)X(n-1.5) \quad (11)$$

although the invention is not restricted in scope in this respect. Of course, equations (11) above represent complex-valued coefficient signals. Therefore, the equations may be rewritten in terms of real-valued and imaginary-valued signal components.

In such an embodiment, timing is employed so that the appropriate coefficient signal components are provided to the filter block, and likewise, the coefficient signal components may be updated, such as described, for example, in aforementioned concurrently filed U.S. patent application Ser. No. 08/581,637 (Raghunath 1).

For example, for this particular embodiment, FIG. 10 provides a table illustrating the coefficient signal components provided during selected clock cycles at selected points in the equalizer filter configuration shown in FIG. 8. As the table illustrates, during operation, the components of the complex-valued coefficient signals are timed in conjunction with corresponding real-valued and imaginary-valued signal samples to ensure that the equalizer filter equations, such as equations (6) for this particular embodiment, are properly implemented. Likewise, in addition to providing selected coefficient signal components to the MUXes, such as MUX 540 and 545, so that the appropriate product may be formed by multipliers 550 and 555 for processing of the signal samples by MAC units 541 and 542, the delay loop formed, such as loops 12 and 14, also permits full-rate equalizer coefficient adaptation. For example, a coefficient signal component provided to MUX 540 is provided, on the next clock cycle, to delay unit 530 so that it may be updated by adder-subtracter 515 in accordance with equations (11) above. A similar approach is employed with respect to loop 14.

FIG. 9 illustrates an embodiment of a random access memory or RAM architecture that may be employed in conjunction with the embodiment shown in FIG. 8, as previously discussed. It employs an approach similar to that illustrated in FIG. 2. Of course, the invention is not limited in scope to this particular architecture. As illustrated, input signal samples are provided to a MUX 610. Likewise, the signal samples are also provided to MUX 620. MUXes are employed to provide the flexibility for the adaptive equalizer and update blocks to process both real-valued and complex-valued signal samples, as explained in more detail hereinafter. For example, where complex-valued signal samples are provided, those signal samples are respectively stored in RAMs 910 and 930, and then RAMs 920 and 940 once RAMs 910 and 920 are full. Therefore, MUX 620 provides the capability to provide delayed complex-valued signal samples from the four random access memories. These complex-valued signal samples may, for example, be stored in the manner previously described. Thus, real-valued and imaginary-valued signals components are provided via MUX 620 to MAC units 541 and 542 so that these signal samples may be appropriately processed, such as previously described. Likewise, in this particular embodiment, a real-valued or imaginary-valued signal component may be provided via MUX 620 to delay unit 640 as well as to adder 650 and subtracter 660. By this technique, when the next signal sample component is available, update signal units 505 and 510 obtain from adder 650 and subtracter 660 the desired $X_{sum}$ and $X_{diff}$ signal components. As will now be appreciated, where a plurality of filter blocks are employed, employing an embodiment of an update block for an adaptive equalizer configuration capable of processing complex-valued coefficient signals in accordance with the invention results in significant hardware savings because each filter block employed uses one less adder-subtracter or arithmetic unit.

It will now be appreciated that the embodiment of an update block illustrated in FIG. 7 and the embodiment of a RAM architecture illustrated in FIG. 9 may, likewise, be employed to process real-valued coefficient signals. For example, the embodiments of an update block in accordance with the invention illustrated in FIG. 8 may be employed to update real-valued coefficient signals in accordance with the following equations:

$$C_0(n + 1) = C_0(n) + e(n - 2)X(n - 2) \quad (12a)$$

$$C_0(n + 1) = C_1(n) + e(n - 1)X(n - 2)$$

$$C_2(n + 1) = C_2(n) + e(n - 2)X(n - 4) \quad (12b)$$

$$C_3(n + 1) = C_3(n) + e(n - 1)X(n - 4)$$

$$C_4(n + 1) = C_4(n) + e(n - 2)X(n - 6) \quad (12c)$$

$$C_5(n + 1) = C_5(n) + e(n - 1)X(n - 6)$$

$$C_6(n + 1) = C_6(n) + e(n - 2)X(n - 8) \quad (12d)$$

$$C_7(n + 1) = C_6(n) + e(n - 1)X(n - 8)$$

although the invention is not restricted in scope in this respect. Likewise, MUX 620 may be configured so that when only real-valued signal samples, $X_r(n)$, arrive, signal paths 630 and 670 provide selected delayed signal samples, such as illustrated by the table in FIG. 11. For example, delay unit 640 may be rendered imperative. Likewise, update signal unit 710 need only receive an appropriately delayed version of error signal sample $e_r$. Therefore, update signal unit 710 may be adapted to provide to adder 720 the delayed signal sample it obtains as the update signal and a control signal will indicate whether this update signal is to be added or subtracted from the coefficient signal provided by delay unit 740. Filter block 543 also has the capability to process real-valued signal samples, as previously described. Therefore, embodiment 500 illustrated in FIG. 8 has the capability to perform full-rate equalizer filter coefficient adaptation for real-valued coefficient signals, although the invention is not limited in scope to full-rate adaptation, as previously indicated. Likewise, it will, of course, be appreciated that an update block in accordance with the invention may be employed in an equalizer filter of any size, although the approach of the particular embodiment illustrated is especially useful for filter sizes that are multiples of 4.

An update block for an adaptive equalizer filter configuration capable of processing complex-valued coefficient signals, such as embodiment 500 illustrated in FIG. 8, for example, may be operated in accordance with the following method. A complex-valued input signal sample for an adaptive equalizer filter configuration and a complex-valued error signal sample produced from the adaptive equalizer filter configuration may be provided. For example, as previously discussed, an error signal sample may be produced by comparing the output signal of the adaptive equalizer filter configuration with the output signal of a slicer. The sum and difference of the real-valued and imaginary-valued signal sample components of the complex-valued input signal sample may be computed. For example, as previously discussed, this sum and difference may be produced by the embodiment of a RAM architecture illustrated in FIG. 9. Likewise, the coefficient signal may be updated with either the sum of the real-valued and imaginary-valued signal sample components or the difference of the real-valued and imaginary-valued signal sample components. Where sign LMS is employed, as previously described, in updating the coefficient signal, either the sum or the difference will be either added or subtracted from the coefficient signal. For example, as previously described, this may be accomplished by update signal unit 710 operating in combination with adder-subtracter 720. As previously described, based on the error signal sample provided, an update signal may be provided by update signal unit 720 to adder-subtracter 720. Likewise, a control signal may be provided to the adder-subtracter to indicate whether the update signal should be added to the coefficient signal or subtracted from the coefficient signal. Thus, in this manner the coefficient signal is updated. Likewise, although the invention is not limited in scope in this respect, the input signal sample employed may comprise a delayed input signal sample and the error signal sample employed may comprise a delayed error signal sample, such as previously described.

While only certain features of the invention have been illustrated and described herein, many modifications, substitutions, changes or equivalents will now occur to those skilled in the art. It is, therefore, to be understood that the appended claims are intended to cover all such modifications and changes as fall within the true spirit of the invention.

The invention claimed is:

1. An update block for an adaptive equalizer filter configuration comprises:

an update signal unit and an adder unit;

said update signal unit and said adder unit being coupled so as to have the capability to update a coefficient signal for an equalizer filter provided to said adder unit;

said update signal unit being adapted to provide to said adder unit an update signal based, at least in part, on at least one of a first and second externally-derived signal, the first and second externally-derived signals respectively comprising the sum and difference of a real-valued and an imaginary-valued signal component of an input signal sample of said equalizer filter configuration.

2. The update block of claim 1, wherein said adder unit constitutes an adder-subtracter unit.

3. The update block of claim 2, wherein said update signal unit is further adapted to provide an update signal based, at least in part, on at least one of a third and fourth externally-derived signal, the third and fourth externally-derived signals respectively comprising a real-valued and an imaginary-valued signal component of an error signal sample of said equalizer filter configuration.

4. The update block of claim 3, wherein said components of the error signal sample of said equalizer filter configuration each comprises a signal component selected from the group consisting essentially of a positive one signal and a negative one signal.

5. The update block of claim 3, wherein the error signal sample comprises a delayed error signal sample.

6. The update block of claim 1, wherein said input signal sample comprises a delayed input signal sample.

7. An integrated circuit comprising:

an update block for an adaptive equalizer filter configuration including an update signal unit and an adder unit;

said update signal unit and said adder unit being coupled so as to have the capability to update a coefficient signal for an equalizer filter provided to said adder unit;

said update signal unit being adapted to provide to said adder unit an update signal based, at least in part, on at least one of a first and second externally-derived signal, the first and second externally-derived signals respectively comprising the sum and difference of a real-valued and an imaginary-valued signal component of an input signal sample of said equalizer filter configuration.

8. The integrated circuit of claim 7, wherein said adder unit constitutes an adder-subtracter unit.

9. The integrated circuit of claim 8, wherein said update signal unit is further adapted to provide an update signal based, at least in part, on at least one of a third and fourth externally-derived signal, the third and fourth externally-derived signals respectively comprising a real-valued and an imaginary-valued signal component of an error signal sample of said equalizer filter configuration.

10. The integrated circuit of claim 9, wherein said components of the error signal sample of said equalizer filter configuration each comprises a signal component selected from the group consisting essentially of a positive one signal and a negative one signal.

11. The integrated circuit of claim 9, wherein the error signal sample comprises a delayed error signal sample.

12. The integrated circuit of claim 7, wherein said input signal sample comprises a delayed input signal sample.

13. A method of updating a complex-valued coefficient signal for an adaptive equalizer filter configuration comprising the steps of:

providing a complex-valued input signal sample for the adaptive equalizer filter configuration and a complex-valued error signal sample from the adaptive equalizer filter configuration;

computing the sum and difference of the real-valued and imaginary-valued signal sample components of said complex-valued input signal sample; and updating the coefficient signal with only one of the sum of the real-valued and imaginary-valued signal sample components of said complex-valued input signal sample and the difference of the real-valued and imaginary-valued signal sample components of said complex-valued input signal sample substantially in accordance with the complex-valued error signal sample provided.

14. The method of 13, wherein updating the coefficient signal comprises adding only one of the sum and the difference.

15. The method of claim 13, wherein updating the coefficient signal comprises subtracting only one of the sum and the difference.

16. The method of claim 13, wherein updating comprises updating with the sum.

17. The method of claim 13, wherein updating comprises updating with the difference.

18. The method of claim 13, wherein the step of providing comprises providing a delayed input signal sample and a delayed error signal sample.

19. The method of claim 18, where the step of providing a delayed input signal sample and a delayed error signal sample comprises providing a selectively variably delayed input signal sample and error signal sample.

* * * * *